United States Patent [19]

Bourret-Courchesne

[11] Patent Number: 5,131,975
[45] Date of Patent: Jul. 21, 1992

[54] CONTROLLED GROWTH OF SEMICONDUCTOR CRYSTALS

[75] Inventor: Edith D. Bourret-Courchesne, Richmond, Calif.

[73] Assignee: The Regents of the University of California, Oakland, Calif.

[21] Appl. No.: 551,433

[22] Filed: Jul. 10, 1990

[51] Int. Cl.$^5$ ............................................. C30B 27/02
[52] U.S. Cl. ................................. 156/616.2; 156/606; 156/607; 156/616.1; 156/616.3; 156/616.4; 156/616.41
[58] Field of Search ...................... 156/606, 607, 616.1, 156/616.2, 616.3, 616.4, 616.41

[56] References Cited

U.S. PATENT DOCUMENTS 3,591,340 7/1971 Plaskett ............................ 156/616.2
4,404,172 9/1983 Gault ................................. 422/248
4,585,511 4/1986 Bult et al. ........................... 156/607
4,923,561 5/1990 Chemans et al. ................. 156/616.4

FOREIGN PATENT DOCUMENTS 0146788 7/1986 Japan .................................. 156/607

OTHER PUBLICATIONS

"The Bridgman And Related Methods", pp. 119–128; Crystal Growth Processes; J. C. Brice, M.A., Ph.D.
Czochralski, Zeits. Phys. Chem. 92 (1918), p. 219.
R. Gremmelmeier, Zeits. Naturforschung, Notizen (1956), pp. 511–513.
Metz et al., Jour. Appl. Phys. 33 (1962), pp. 2016–2017.
J. B. Mullin et al., Jour. Phys. Chem. Solids 26 (1965), pp. 782–784.
A. G. Fischer, Journal of the Electrochemical Society 117 (1970), pp. 41C–47C.
Blum et al., Journal of the Electrochemical Socity, 120 (1973), pp. 588–589.
W. A. Chang et al., Jour. of Crystal Growth 22 (1974), pp. 147–258.
Woodbury, Jour. of Crystal Growth 35 (1976), pp. 49–54.
W. A. Gault et al., Jour. of Crystal Growth 74 (1986), pp. 491–506.
K. Hoshikawa et al., Jour. of Crystal Growth, 94 (1984), pp. 643–650.
W. G. Pfann, Zone Melting, John Wiley & Sons, Second Ed., 1958, pp. 254–285.

Primary Examiner—Robert Kunemund
Assistant Examiner—Felisa Garrett

[57] ABSTRACT

A method for growth of III-V, II-VI and related semiconductor single crystals that suppresses random nucleation and sticking of the semiconductor melt at the crucible walls. Small pieces of an oxide of boron $B_xO_y$ are dispersed throughout the comminuted solid semiconductor charge in the crucible, with the oxide of boron preferably having water content of at least 600 ppm. The crucible temperature is first raised to a temperature greater than the melt temperature $T_{m1}$ of the oxide of boron ($T_{m1}=723°$ K. for boron oxide $B_2O_3$), and the oxide of boron is allowed to melt and form a reasonably uniform liquid layer between the crucible walls and bottom surfaces and the still-solid semiconductor charge. The temperature is then raised to approximately the melt temperature $T_{m2}$ of the semiconductor charge material, and crystal growth proceeds by a liquid encapsulated, vertical gradient freeze process. About half of the crystals grown have a dislocation density of less than $1000/cm^2$. If the oxide of boron has water content less than 600 ppm, the crucible material should include boron nitride, a layer of the inner surface of the crucible should be oxidized before the oxide of boron in the crucible charge is melted, and the sum of thicknesses of the solid boron oxide layer and liquid boron oxide layer should be at least 50 μm.

6 Claims, 4 Drawing Sheets

CONTROLLED GROWTH OF SEMICONDUCTOR CRYSTALS

This invention was made with Government support under Contract No. DE-AC03-76SF00098 between the U.S. Department of Energy and the University of California for the operation of Lawrence Berkeley Laboratory. The Government has certain rights in this invention.

TECHNICAL FIELD

This invention relates to growth of III-V, II-VI and related semiconductor single crystals in a boron nitride crucible.

BACKGROUND ART

Growth of large and uniform semiconductor substrates, using III-V semiconductor substrates such as GaAs, are now routinely required for electronic and optoelectronic applications. Currently, semi-insulating semiconductor substrates for integrated circuit devices and substrates for thin film growth are usually prepared by the liquid encapsulated Czochralski ("LEC") technique and the horizontal Bridgman ("HB") technique, respectively. Czochralski first proposed his method of crystal growth in Zeits. Phys. Chem. 92 (1918) 219, and the method was first used for growth of germanium single crystals in 1950. R. Gremmelmeier, Zeits. Naturforschung, 11A (1956) 511. Metz et al., Jour. Appl. Phys. 33 (1962) 2016, and later Mullin et al., Jour. Phys. Chem. Solids 26 (1965) 782, developed a liquid encapsulation technique that could be applied to the Czochralski method. The LEC technique became the industry's standard for production of semi-insulating semiconductor crystals such as GaAs, especially after it was demonstrated that pyrolytic boron nitride ("PBN") crucibles could be used to produce undoped, semi-insulating crystals.

The HB technique and a horizontal gradient freeze ("HGF") technique were widely used to grow doped conducting semiconductor crystals as well as chromium-doped semi-insulating crystals. It was assumed that the horizontal configuration was necessary in order to limit confinement of the crystal and to allow free expansion of the crystal as it solidified. This technique is still widely used mainly to produce doped crystals because preventing silicon contamination from the quartz ampule is difficult.

A vertical Bridgman ("VB") technique and a vertical gradient freeze ("VGF") technique were discussed by Fisher, Jour. Electrochem. Soc., 117 (1970) 41C, in a review of crystal growth techniques for II-VI and III-V compounds. Three years later, Blum et al., Jour. Electrochem. Soc. 120 (1973) 588, reported successful growth of 1.5 cm diameter GaP single crystals in PBN crucibles by a liquid encapsulated vertical freeze technique ("LE-VGF"). These crystals were found to be appreciably less strained, lower in dislocation density, easier to grow, and with improved diameter control, as compared to the conventional LEC growth technique for GaP. However, when the LE-VGF technique was scaled up to grow larger diameter GaP crystals, spurious nucleation occurred at the crystal/seed melt junction, and reproducibility in growing single crystals was lost, as reported by Woodbury, Jour. of Crystal Growth 35 (1976) 49. Chang et al., Jour. of Crystal Growth 22 (1974) 247, have demonstrated the flexibility of the VGF technique in growing small diameter GaAs unseeded ingots. In 1986 Gault et al., Jour. of Crystal Growth 74 (1986) 491, first studied the growth of high quality III-V semiconductor crystals of large diameter. U.S. Pat. No. 4,404,172, issued to Gault, discloses use of a VGF technique for GaAs crystal growth.

However, the problem of use of the LE-VGF technique or a liquid encapsulated VB technique for growth of large diameter single crystals still faces the problems of random nucleation within the crucible during crystal growth, high dislocation densities and general difficulty of control. Hoshikawa et al., Jour. of Crystal Growth 94 (1989) 643, have used the VGF method with liquid encapsulation provided by boron oxide that is placed at the top of the semiconductor charge in the crucible and allowed to melt and completely cover the top surface of the semiconductor charge during crystal growth. This technique may be called the liquid encapsulated, vertical Bridgman ("LE-VB") technique and does not require arsenic pressure control. A PBN crucible about 8 cm in diameter was used for crystal growth, and vertical growth rate is approximately 0.6 cm/hour. Dislocation density within the whole crystal was not uniform and varied from 5,000 to 40,000/cm$^2$. A relatively low temperature gradient of 15°–40,000° C./cm near the crystal growth interface was maintained in order to control crystal diameter variation.

Another approach for control of random nucleation and "sticking" at the crucible side walls is disclosed by Clemans et al. in U.S. Pat. No. 4,923,561. Here, the side walls of a PBN crucible are first oxidized to an unstated depth, using formation of native oxide thereon, and a GaAs single crystal is then grown in the crucible by the VGF technique. No liquid encapsulation of the entire semiconductor charge is used here. No dislocation density numbers are reported, nor is the problem of crystal diameter control discussed.

What is needed is a technique for growing III-V and II-VI semiconductor single crystals that will suppress random nucleation and sticking at the crucible walls, will produce low dislocation densities, will allow control of crystal diameter and will be reasonably easy to use.

SUMMARY OF THE INVENTION

These needs are met by a liquid encapsulated, vertical gradient freeze technique in which an oxide of boron melt is positioned between the semiconductor charge and the crucible walls. The boron oxide, in small, solid chunks, is initially distributed among the semiconductor or other non-reactive charge fragments in a boron nitride crucible. The temperature of the crucible contents is then raised to a temperature $T > T_{melt}$ (boron oxide) = 723° K. in order to fully melt the boron oxide and allow it to form a very thin liquid layer thereof between the semiconductor charge and the crucible walls, as well as forming a cap at the top of the semiconductor charge within the crucible. The boron oxide has a density of 1.5–1.63 gm/cm$^3$ (decreasing with increasing temperature), which is much less than the density of the III-V or II-VI semiconductor material. For example, GaAs has a density of 5.32 gm/cm$^3$, GaP has a density of 4.13 gm/cm$^3$ and CdTe has a density of 5.86 gm/cm$^3$. The semiconductor densities are much higher than the boron oxide density, and liquid boron oxide is not appreciably miscible with the melted semiconductor material, so that the semiconductor material will displace the boron oxide from the center portion and bottom portion of the crucible after the temperature is further raised above the semiconductor softening temperature ($T_{melt} = 1511°$ K. for GaAs) in order to melt the semiconductor charge. The liquid boron oxide layer appears to fully wet the boron nitride crucible walls and to suppress or totally eliminate random nucleation and the tendency of the semiconductor charge to stick to the otherwise-exposed crucible walls, if the boron oxide has a water content of at least 600 ppm.

BEST MODE FOR CARRYING OUT THE INVENTION

Figure 1B:
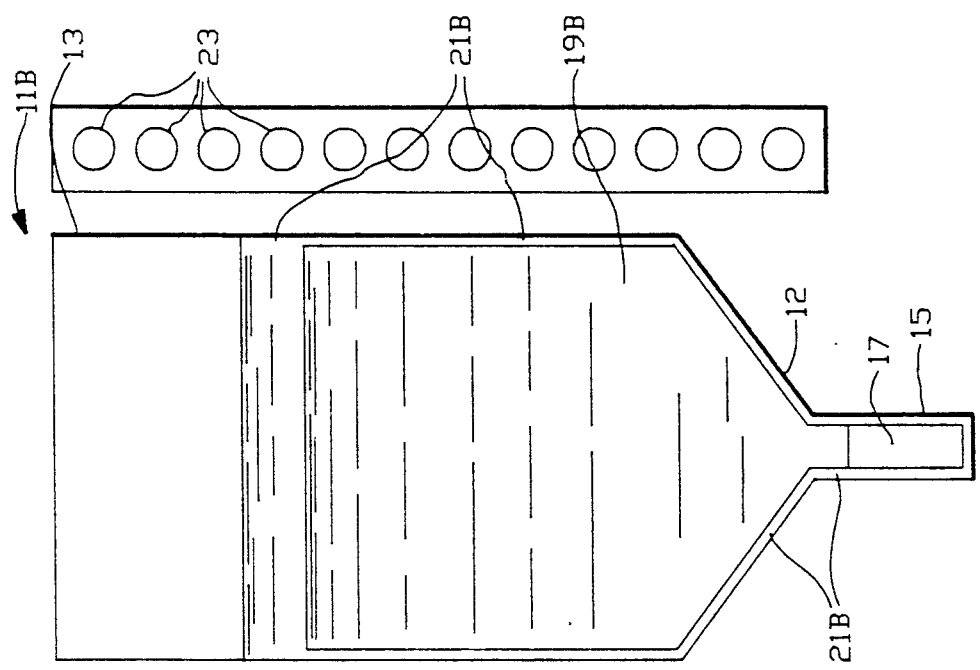
FIGS. 1A and 1B illustrate one embodiment of the invention, in a vertical configuration.
Figure 1A:
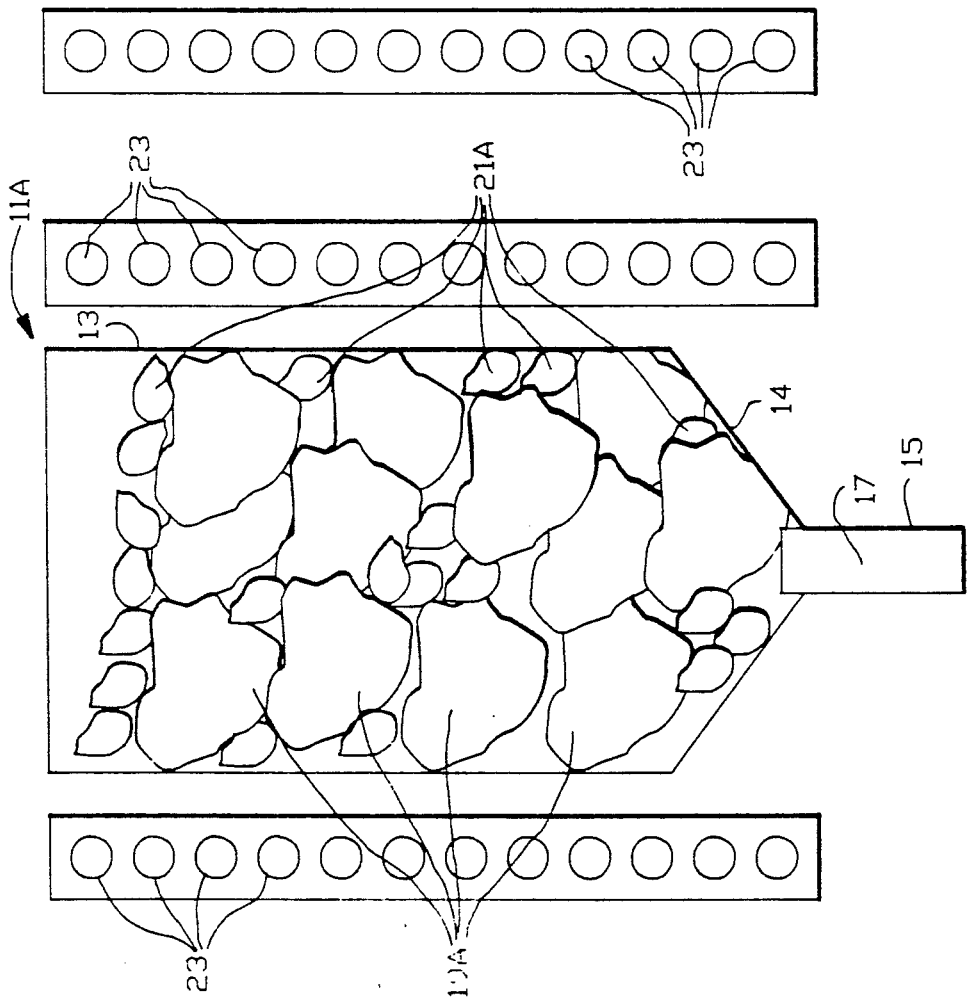

With reference to FIG. 1A, one embodiment 11A for practicing the invention begins with a crucible 13 of generally cylindrical shape, having a conical bottom 14 with a central region at the bottom formed as a well 15 that contains a solid seed crystal material 17 as shown. The seed crystal 17 extends upward to the top of the well to present a seed crystal surface that serves as a crystalline format for growth of the semiconductor material in the crucible. The semiconductor material is preferably a III-V, II-VI or related compound 19A, such as GaAs, GaP, GaSb, InAs, InP, InSb, AlAs, AlP, AlSb, $Ga_xAl_{1-x}As$, CdS, CdSe, CdTe, PbSe, PbTe, PbSnTe, ZnO, ZnS, ZnSe or ZnTe, formed as solid chunks of modest size of the material placed inside the crucible 13. Solid pieces 21A of an oxide of boron $B_xO_y$ such as $B_2O_3$, are interspersed with the larger solid chunks of semiconductor material throughout the crucible 13 as shown, and the temperature of the crucible contents is raised to a first temperature $T_1$, greater than the melt temperature of the oxide of boron (= 723° K. for boron oxide $B_2O_3$). A convenient first temperature is $T_1 = 800°$ K. This allows the oxide of boron $B_xO_y$ (herein referred to as "boron oxide" for convenience) to fully melt and form a liquid that flows toward the bottom of the crucible 13.

Before the crucible contents are increased to the temperature $T_1$, the pressure in the growth chamber must be increased to about p = 1 atm or more, in order to prevent the liquefied $B_2O_3$ from crawling up the crucible walls and over the crucible top by capillary action. In a quartz growth chamber that is to be used to grow an As-containing crystal, As pressure of approximately one atmosphere is often provided by heating an As source to a temperature $T \geq 890°$ K., for vaporization control of the As in the molten charge. In a neutral atmosphere, stainless steel growth chamber, the atmosphere is pressurized with $N_2$ before the crucible and charge are heated to the temperature $T_1$. Either of these pressurization approaches will suffice to prevent boron oxide overflow.

At this time, most or all of the conical bottom surface of the crucible and the walls of the well at the bottom will be covered by a layer of liquid boron oxide that has flowed down through the still-solid chunks of semiconductor charge. As the temperature is raised to a second temperature $T_2 = T_m$, the melt temperature of the semiconductor charge material, the chunks of semiconductor charge also soften or melt and displace the lighter liquid and immiscible boron oxide adjacent to the bottom of the crucible 13. When the semiconductor charge material has thoroughly softened or melted, the boron oxide forms a liquid layer 21B that totally encapsulates the liquefied semiconductor charge 19B and the seed crystal material 17 at the bottom of the crucible as illustrated in FIG. 1B. The seed crystal material may also be partly liquefied at the beginning of the crystal growth process described here. Heating of the crucible charge in FIGS. 1A and 1B is provided by an assembly of heating elements 23 in which the axial position of the thermal gradient is moved to induce solidification by changing the power input to the heating elements (vertical gradient freeze technique). Alternatively, solidification can be induced by maintaining the power input to the heating elements 23 and lowering the crucible 13 relative to the heating elements (vertical Bridgman technique).

In the conventional vertical gradient freeze technique, the semiconductor crystal grows in contact with the crucible wall according to a process well known in this area of art. The crucible wall must be nonreacting and must not be wetted by the semiconductor melt material. Unfortunately, clean pyrolytic boron nitride material generally used in crucible walls is partially wetted by liquid semiconductor material such as GaAs, and reproducible crystal growth cannot be achieved. The melted semiconductor charge material wets PBN sufficiently well for random nucleation of low grain boundaries to be commonly observed.

I have developed a total liquid encapsulation technique, using boron oxide, that allows reproducible growth of semiconductor single crystals in PBN crucibles. In the paper by Hoshikawa et al., op. cit., the authors state three critical issues that must be addressed for reproducible crystal growth: (1) ensuring proper seeding by using a seed well of diameters slightly larger than the seed crystal; (2) providing a continuous layer of boron oxide between the crucible walls and the semiconductor charge material and (3) preventing cracking by keeping a relatively uniform temperature distribution in the crystal during cooling thereof. The new technique described here achieves all of these goals. A thin encapsulating layer of liquid boron oxide is formed at the crucible walls and bottom surfaces, of thickness estimated to be 50–100 $\mu$m, that prevents random nucleation and sticking by the semiconductor charge at the crucible walls.

In liquid encapsulated Czochralski growth of GaAs, the water content of the boron oxide affects the incorporation of impurities such as boron, carbon and silicon, and these impurities can cause deviation from predicted stoichiometry and even promote crystal twinning. Here, surprisingly, the water content of the boron oxide is used to good advantage. Boron oxide has a lower density than the semiconductor charge material such as GaAs and CdTe and is not miscible in these semiconductor materials. When the semiconductor material and the boron oxide are both in liquid form, the boron oxide will float on top of the semiconductor melt material, as indicated in FIG. 1B. If boron oxide pellets are loaded on the top of the semiconductor charge with no special precautions being taken, as discussed in the Hoshikawa et al. article, op. cit., some boron oxide will flow down the crucible wall, but a continuous coating of boron oxide on the crucible walls and bottom surfaces is unlikely. The seed-melt interface must also be encapsulated for proper seeding, as mentioned by Hoshikawa et al. Therefore, small pieces of boron oxide are placed just above the seed as well as elsewhere throughout the comminuted semiconductor charge, and the seed crystal has a slightly smaller diameter than the inside diameter of the seed well (preferably 2-5 percent smaller). When the boron oxide has liquefied and the semiconductor charge material has softened or melted, the liquid boron oxide moves down around the seed well and moves up along the crucible walls and creates a thin, approximately uniform coating of the crucible walls and bottom surfaces. For a 5 cm diameter crucible and 1 kgm of semiconductor charge material, approximately 40 grams of boron oxide is used to form a boron oxide liquid layer of thickness approximately 1-100 $\mu$m to coat the crucible walls and bottom surfaces of the melt by a layer of boron oxide of thickness approximately one cm. For a 7.5 cm diameter crucible and 4 kgm of semiconductor charge material, approximately 100 gm of boron oxide is used to form the liquid layer.

A thermal gradient of at most 10° K./cm, as measured by thermocouples positioned outside the quartz ampule is maintained over the solid side of the solid-melt interface in the semiconductor material, and very shallow thermal gradient ($\approx$1.2° K./cm) are maintained near the interface. Crystal vertical growth rates of 3, 4 and 5 mm/hour have been used, and GaAs crystals of diameters 3.7, 5.0, 6.3 and 7.5 cm have been grown using this LE-VGF technique.

Figure 2:
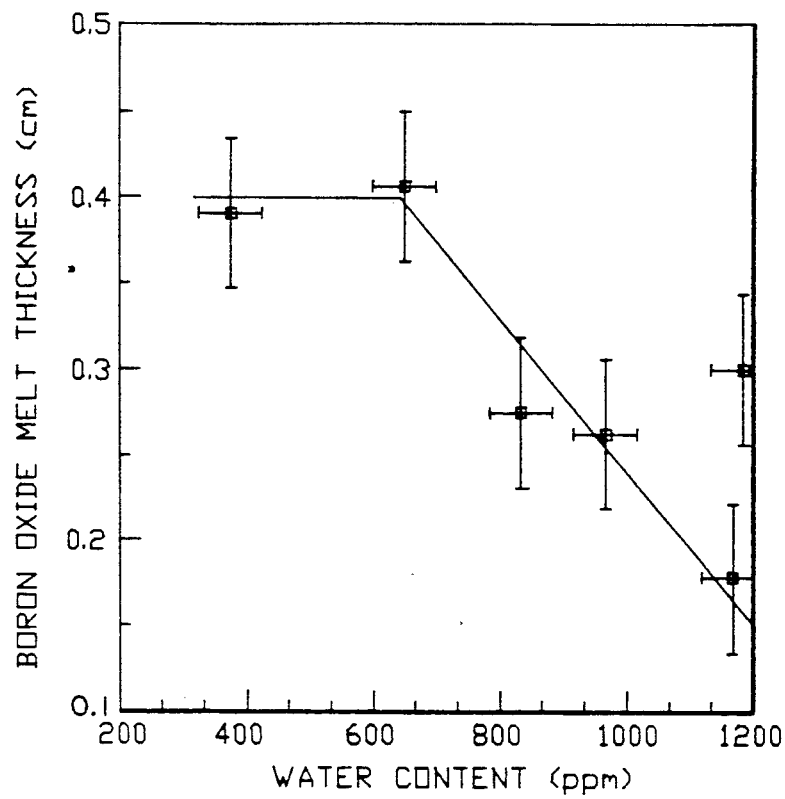
FIG. 2 is a graphic view illustrating the increase, with increasing water content of boron oxide, of the oxide's tendency to wet a surface of pyrolytic boron nitride.

As the water content of boron oxide increases, the wetting of the PBN walls by the boron oxide increases. A simple test was conducted to verify the spread of liquefied boron oxide, containing various concentrations of water, on a PBN surface. Solid pieces of boron oxide were placed on a PBN surface and heated to T=1373° K. under a nitrogen atmosphere. The average thickness of the boron oxide layer formed on the PBN substrate was taken as a measure of the spread of the boron oxide because the exact wetting angle could not be measured. The results are shown in FIG. 2, where wetting of the PBN substrate by boron oxide appears to increase, for water concentration in the boron oxide increasing above 600 ppm.

The thickness of the boron oxide "puddle" on a face of the PBN substrate is taken as a measure of the boron oxide to wet the PBN surface: the thinner the puddle, the greater the lateral spread of the liquid boron oxide. Based upon the data shown in FIG. 2, the puddle thickness appears to be relatively unchanging until a threshold of approximately 600 ppm water content is reached, and for increasing water content above this threshold the puddle thickness falls with increasing water content. A suitable range of water content or fraction f appears to be f=600-1200 ppm, although higher fractions f may also be used. Experimentally, I find that a water content fraction f down to about 400 ppm may be used, although the boron oxide at this lower fraction f is not optimal.

When relatively dry boron oxide, having a water content much less than 600 ppm, is used, coverage of the crucible walls using the above loading procedure is found to be more random. In order to obtain good adhesion of the "dry" boron oxide onto the PBN crucible walls, it is necessary first to create a thin layer of boron oxide. One method of doing this is to form a native oxide layer from the boron nitride walls by directing a flow of oxygen at a temperature exceeding 1173° K. against the inside walls of the crucible. The outer surface of the crucible walls are protected from oxidization by a flow of nitrogen or argon. Currently, I use a temperature T=1373° K. with about 14 hours of oxygen flow to create a native oxide layer of thickness approximately 50 $\mu$m of this native oxide. This approach does provide satisfactory wetting of the crucible walls by the "dry" boron oxide liquid layer. However, if the water concentration in the boron oxide is at least 600 ppm, formation of this native oxide layer appears to be unnecessary.

A second approach, which is optional for boron oxide fragments having a water fraction f of at least 600 ppm and is recommended where the fraction f is less than 600 ppm, uses a layer of native boron oxide grown on the boron nitride crucible interior walls plus a layer of liquid boron oxide produced as described above. The sum of the thicknesses of these two boron oxide layers should be approximately 50 $\mu$m or greater. The presence of the native boron oxide here allows the liquid layer of "dry" boron oxide (f<600 ppm) to wet the crucible wells satisfactorily to prevent random nucleation of the melted semiconductor charge at the crucible walls.

Formation of the native oxide layer may be done by heating the inner surface of the crucible walls to a temperature of approximately T=1373° K. or greater for a time period of approximately 40 minutes or more, and directing a flow of oxygen gas at a temperature of approximately T=1173° K. or greater against the heated crucible walls' inner surface during this time interval to promote formation of the native oxide layer thereat. If the oxygen temperature is approximately T=1673° K., about 30 min suffices to produce 50 $\mu$m of native boron oxide.

The crystals of semiconductor compounds produced by either of these processes have relatively low dislocation densities, with a medium density below 10,000/cm$^2$. Depending upon the water content of the boron oxide, boron oxide appears to act as a getter or as a barrier to contamination, to remove trace amounts of some impurities that might otherwise affect the electrical properties of the crystal.

Figures 3A, 3B:
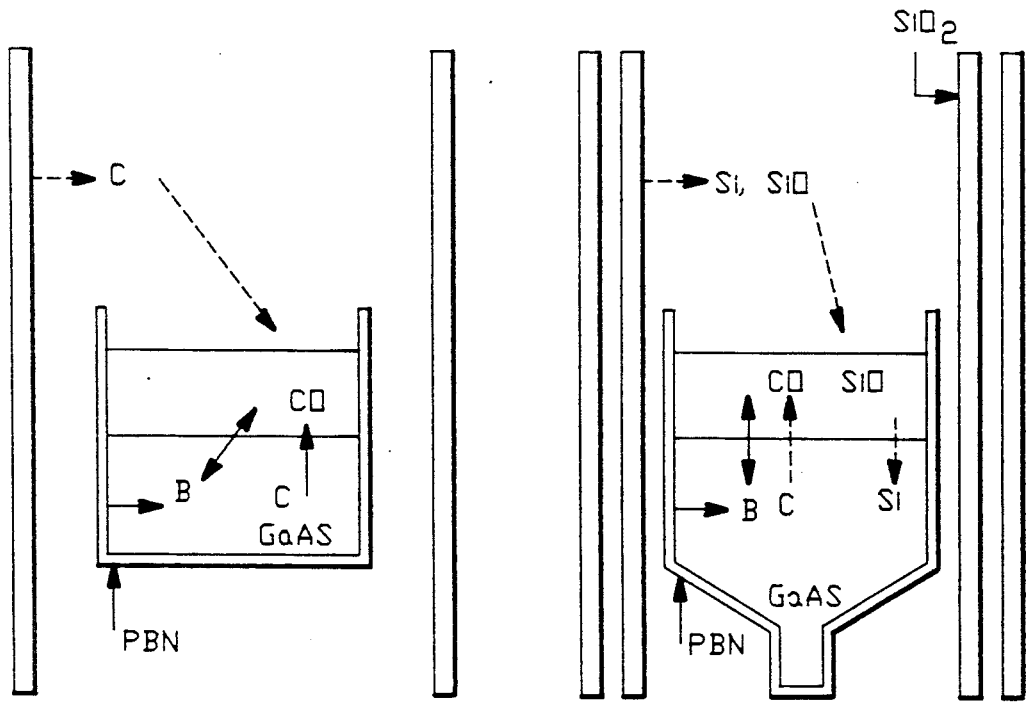
FIGS. 3A and 3B illustrate the use of a liquid boron oxide encapsulating layer to absorb impurities released in the growth chamber.

Another advantage of use of the LE-VGF technique disclosed here is that the liquid boron oxide layer formed around the semiconductor charge in the crucible absorbs impurities such as C, Si, SiO and O that are unavoidably liberated from a quartz tube used as an outer wall for the growth chamber, as illustrated in FIG. 3A. If a carbon-based tube is used as the outer wall for the growth chamber, as illustrated in FIG. 3B, carbon particles and impurities will be liberated and will be absorbed in the semiconductor charge in the crucible, in the absence of a liquid boron oxide layer that encapsulates the semiconductor charge.

Removal from the crucible of the cooled semiconductor crystal, with a coating of congealed boron oxide thereon, is done by dissolving the boron oxide, through immersion of the crucible and charge in either boiling methanol or boiling de-ionized water for four hours or more.

Figure 4:
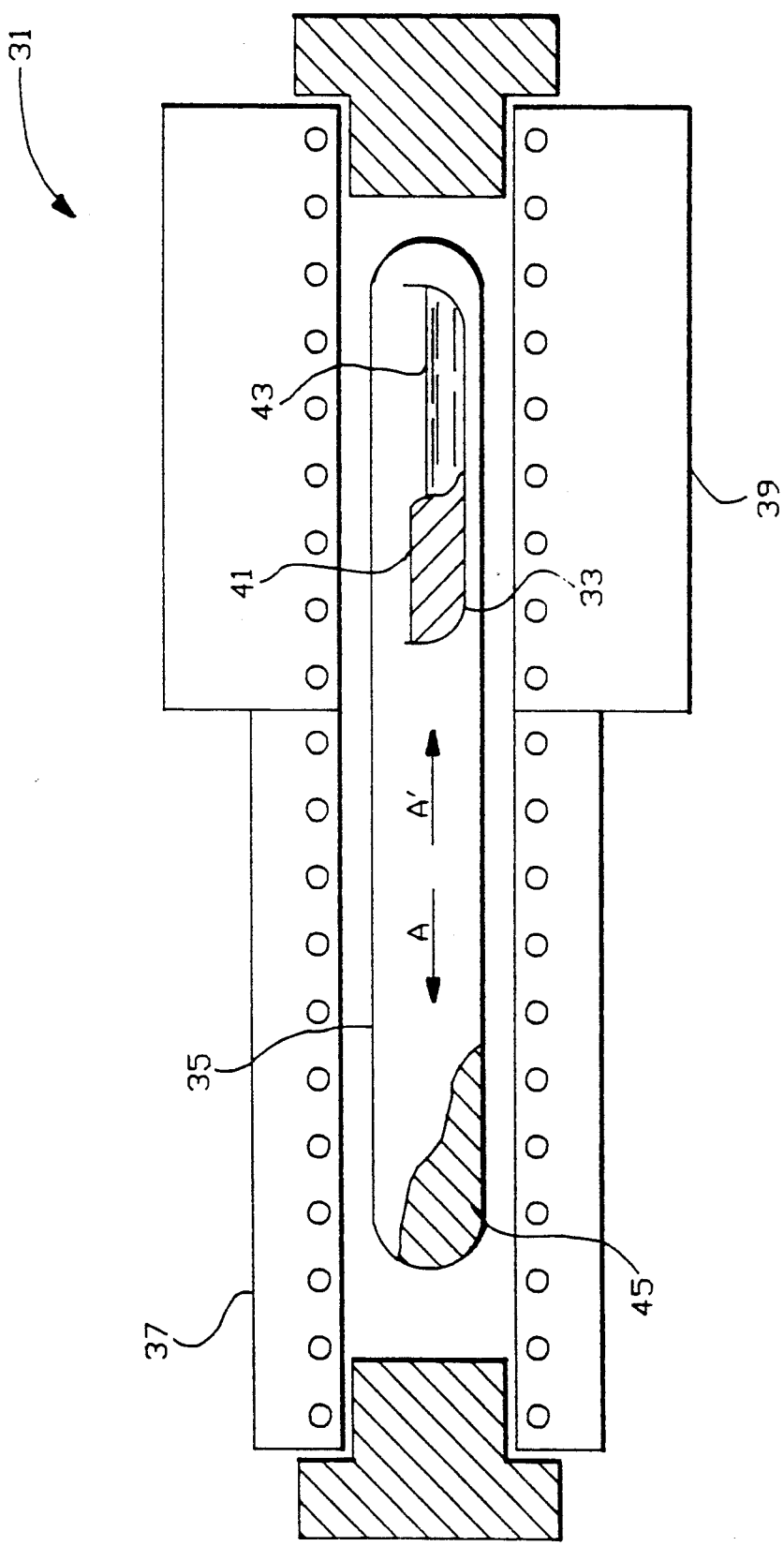
FIG. 4 illustrates another embodiment of the invention, in a horizontal configuration.

FIG. 4 illustrates another embodiment 31 of operation of the invention, in which a PBN (or other suitable high temperature material) boat 33 is positioned inside an ampoule 35 that is positioned within a low temperature furnace 37 and a high temperature furnace 39, laid end-to-end as shown. The material for the ampoule 35 may be quartz. A seed crystal 41 of the desired crystal material is positioned at a first end of the boat 33, within the high temperature furnace 39 but closest to the low temperature furnace 37, and the semiconductor charge and boron oxide material 43 are positioned at a second end of the boat 33 Excess column V or VI material 45, such as P, As, Sb, S, Se or Te is positioned in the ampoule at a location spaced apart from the boat 33 and is heated to an appropriate temperature (e.g., $T \approx 900°$ K. for As) to provide an appropriate gas over-pressure (e.g., $p=1$ atm for As) to suppress the tendency of the column V or VI element in the boat to vaporize at high temperatures.

Initially, the semiconductor and boron oxide material 43 in the boat 33 are brought to a temperature $T=T_1$ greater than the melt temperature of the boron oxide, to cause melting thereof while the semiconductor material is maintained as a solid. As noted above in connection with FIG. 1, the liquid boron oxide is lighter in density than the semiconductor material so that the liquid boron oxide will form a coating, of possibly irregular thickness, on the inner surface of the PBN boat 33, between the boat and the semiconductor material. The temperature of the semiconductor and boron oxide material 43 in the boat 33 is then raised to a temperature $T=T_2 \approx T_{melt}$ for the semiconductor material, in order to melt all material (except perhaps the seed crystal 41 in the boat 33. The liquid semiconductor material then coalesces and displaces substantially all of the liquid boron oxide at the bottom of the boat 33, except a thin liquid boron oxide coating of the inner surface of the boat. The remainder of the liquid boron oxide forms a liquid encapsulating layer overlying the upper surface of the liquid semiconductor material, similar to the two-layer configuration shown in FIG. 1B. The ampoule 35 is now moved axially in the direction A shown relative to the furnaces 37 and 39 in order to slowly reduce the temperature of the semiconductor material 43 and induce crystallization at the solid-liquid interface within the boat 33. Alternatively, the two furnaces 37 and 39 may be moved in the opposite direction A' relative to the boat 33 in order to induce crystallization. As a third alternative, the local temperature in the high temperature furnace 39 may be varied to establish a moving thermal gradient at the liquid-solid interface of the semiconductor material.

Growth of the semiconductor crystal proceeds by a liquid encapsulated, horizontal gradient freeze approach (LE-HGF) that is analogous to the LE-VGF technique discussed above. If the water content of the solid boron oxide material placed in the charge 39 is at least 600 ppm, the liquefied boron oxide layer will suffice by itself to prevent or suppress random nucleation at the crucible walls by the semiconductor charge. If the water content of this solid boron oxide is less than 600 ppm, a layer of the boron nitride crucible walls at the inner surface is preferably oxidized to form a native oxide first; then the liquid boron oxide layer at the inner surface is formed, where the sum of the thicknesses of the liquid boron oxide layer and the solid boron oxide layer is approximately 50 μm or greater.

Another approach that may be used here is the zone melting technique first proposed by W. G. Pfann in U.S. Pat. Nos. 2,739,088 and 2,813,048 and in his book *Zone Melting*, John Wiley & Sons, Second Ed., 1958, pp. 254–285. This material is incorporated herein by reference. In a zone melting approach, shown in a vertical embodiment 51 in FIG. 5, a vertically oriented PBN crucible 53 is provided that has side walls 53 and has a suitably sloping bottom 54, with a crucible wall 55 positioned at the bottom thereof to hold a seed crystal 57 of the desired semiconductor material, similar to that shown in FIGS. 1A and 1B.

Initially, the comminuted semiconductor material 59A and the boron oxide 61 are loaded into the crucible 52, as shown in FIG. 1A, and the temperature is raised to a level $T=T_1>723°$ K. in order to melt the boron oxide and maintain the semiconductor material in solid form. As before, the liquid boron oxide forms a coating on the PBN crucible 52. The temperature of the crucible charge is now raised to approximately the semiconductor temperature $T=T_2$ only in a zone, denoted MZ, of semiconductor material 59B initially adjacent to the exposed face of the seed crystal 57. The remainder of the semiconductor material 59A remains at a lower temperature and in solid form. As the higher temperature semiconductor material in the crucible 52 melts, it displaces the liquid boron oxide at and near the bottom of the crucible, except for a thin coating of liquid boron oxide on the inner surface of the PBN crucible 52. The melt zone MZ is maintained as a narrow region, within which the temperature is at or slightly above the semiconductor temperature $T_2$. The local temperature of all semiconductor material outside this melt zone MZ satisfies $T<<T_2$ so that the remainder of the semiconductor material is solid. The melt zone MZ is now caused to move upward in a direction approximately parallel to the axis of the crucible 52, by activation of different groups of heating coils 63 surrounding the crucible or by use of a single panel of heating coils that is translated upward relative to the crucible.

Figure 5:
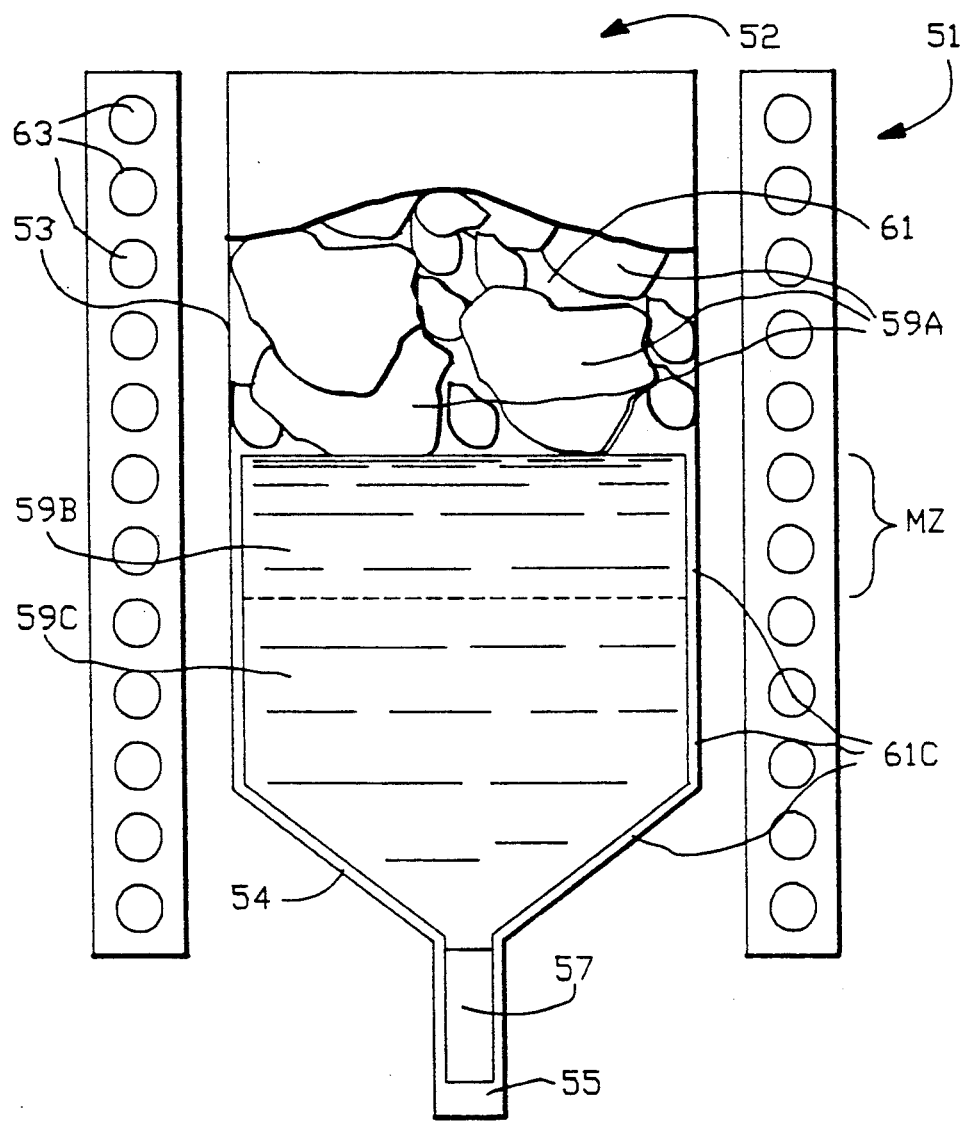
FIG. 5 illustrates another embodiment, employing a zone melting approach in a vertical configuration.

As the melt zone MZ moves upward, relative to the bottom of the crucible 52, the semiconductor material 59C below the melt zone in the crucible crystallizes, with a thin coating 61C of boron oxide lying between this recrystallized material and the adjacent portion of the crucible inner surface. In FIG. 5, three zones of semiconductor material appear, a first zone of material 59A that is in its initial solid form, a second zone (coincident with the melt zone MZ) of material 59B that is in liquid form, and a third zone of semiconductor material 59C that is crystallized. The protective action of the boron oxide coating is as discussed in connection with FIGS. 1A, 1B and 4. The liquid boron oxide 61 that remains after the semiconductor material is crystallized within the crucible 52, forms a liquid encapsulating layer overlying the otherwise-exposed surface of the crystallized semiconductor material.

As before, the water content present in the boron oxide ($\geq 600$ ppm or $<600$ ppm) determines whether the thin boron oxide coating at the crucible walls and bottom can be used as is, or whether a thin layer of PBN at the crucible inner surfaces must be first oxidized to provide a proper surface for the liquid boron oxide to adhere to.

The zone melting approach may be carried out in a vertical or a horizontal configuration, using the gradient freeze approach or the Bridgman approach.

The discussions above have assumed that the crucible charge is primarily a semiconductor material, from which the grown crystal will be formed. However, any material that is non-reactive (as a solid and as a melt) with, and non-miscible with, liquid boron oxide may be used as the primary material for the crucible charge, provided the softening or melt temperature of this primary charge material is much higher than the melt temperature of the boron oxide.

What is claimed is:

1. In a method of growing large single crystals of semiconductive compounds and alloys thereof by heating under pressure a charge of semiconductor material, a boron oxide encapsulant, and a seed crystal in a crucible, the improvement comprising:

interspersing pieces of precursor semi-conducting material and pieces of boron oxide encapsulant within the crucible containing the seed crystal to produce said charge prior to heating.

2. The method of claim 1, further comprising the step of choosing said semiconductor material from the class of III-V semiconductor materials with melt temperatures much higher than 800° K. and consisting of GaAs, $Ga_xAl_{1-x}As$, GaP, GaSb, InAs, InP, InSb, AlAs, AlP and AlSb.

3. The method of claim 1, further comprising the step of choosing said semiconductor material from the class of II-VI and related semiconductor materials with melt temperatures much higher than 500° K. and consisting of CdS, CdSe, CdTe, PbSe, PbTe, PbSnTe, ZnO, ZnS, ZnSe and ZnTe.

4. The method of claim 1, wherein a piece or pieces of the encapsulant are deposited adjacent to the seed crystal.

5. The method of claim 1, wherein the water content of the encapsulant is between about 400 ppm and 1200 ppm.

6. The method of claim 5, wherein said water content is between about 600 ppm and 1200 ppm.

* * * * *